(12) United States Patent
Ministeru (10) Patent No.: US 10,090,965 B2
(45) Date of Patent: Oct. 2, 2018

(54) ELECTRONIC CIRCUIT AND METHOD FOR TRANSFERRING DATA BETWEEN CLOCK DOMAINS

(71) Applicant: INFINEON TECHNOLOGIES AG, Neubiberg (DE)

(72) Inventor: Iulian Ministeru, Bucharest (RO)

(73) Assignee: INFINEON TECHNOLOGIES AG, Neubiberg (DE)

( * ) Notice: Subject to any disclaimer, the term of this patent is extended or adjusted under 35 U.S.C. 154(b) by 225 days.

(21) Appl. No.: 14/737,505

(22) Filed: Jun. 12, 2015

(65) Prior Publication Data

US 2016/0365969 A1 Dec. 15, 2016

(51) Int. Cl.
| | |
|---|---|
| H04L 1/00 | (2006.01) |
| G06F 5/06 | (2006.01) |
| H04L 25/49 | (2006.01) |
| H04L 7/00 | (2006.01) |
| H03M 13/13 | (2006.01) |
| H04L 12/40 | (2006.01) |

(52) U.S. Cl.
CPC .............. *H04L 1/0041* (2013.01); *G06F 5/06* (2013.01); *H03M 13/13* (2013.01); *H04L 1/0045* (2013.01); *H04L 7/0045* (2013.01); *H04L 12/40* (2013.01); *H04L 25/49* (2013.01)

(58) Field of Classification Search
CPC ........ H04N 21/4305; G01R 31/318594; G11C 7/222; H04L 1/20; H04L 27/2657; H04L 7/0054; H04L 1/0041; H04L 1/0045; H04L 12/40; H04L 25/49; H04L 7/0045; H04B 1/7087; H04J 3/0638; H04J 3/0682; H03M 13/00; H03M 13/13; G06F 5/06
See application file for complete search history.

(56) References Cited

U.S. PATENT DOCUMENTS

| | | | | |
|---|---|---|---|---|
| 4,451,916 A | * | 5/1984 | Casper | H04B 10/2504 370/226 |
| 4,562,577 A | * | 12/1985 | Glover | G11B 20/1833 369/44.34 |
| 4,597,077 A | * | 6/1986 | Nelson | H04L 5/24 370/352 |
| 4,633,471 A | * | 12/1986 | Perera | H03M 13/15 714/758 |
| 4,679,191 A | * | 7/1987 | Nelson | H04L 5/24 370/355 |
| 5,349,350 A | * | 9/1994 | Blagaila | G06T 9/005 341/100 |
| 2007/0176801 A1 | * | 8/2007 | Robinett | G11C 8/10 341/50 |

* cited by examiner

*Primary Examiner* — Cynthia Britt
(74) *Attorney, Agent, or Firm* — Viering, Jentschura & Partner MBB (57) ABSTRACT

According to one embodiment, an electronic circuit is described comprising a first clock domain configured to operate according to a first clock signal, a second clock domain configured to operate according to a second clock signal different from the first clock signal, an encoding circuit, in the first clock domain, configured to encode data to be transmitted from the first clock domain to the second clock domain into codewords and configured to supply the codewords to an interface between the first clock domain and the second clock domain and a reception circuit, in the second clock domain, configured to receive data words from the interface, to decode valid codewords and to discard invalid codewords.

14 Claims, 8 Drawing Sheets

```
signal neutral: std_ulogic_vector(m downto 1)

type code_array_t is array(m downto 1) of std_ulogic_vector(m downto 1);
signal code : code_array_t;

begin
neutral <= '10011....';    -- can use any random value with m bits gen_codes: process (neutral)
variable mask : std_ulogic_vector(m downto 1);
begin
  for i in 1 to m loop
    mask   := (others => '0');
    mask(i) := '1';           -- set only one bit to 1
    code(i) <= neutral xor mask; -- invert one bit of neutral
  end loop;
end process;
```

ELECTRONIC CIRCUIT AND METHOD FOR TRANSFERRING DATA BETWEEN CLOCK DOMAINS

TECHNICAL FIELD

The present disclosure relates to electronic circuits and methods for transferring data between clock domains.

BACKGROUND

Information transfer in digital logic may happen either between logic located in the same clock domain, or between different clock domain regions. Whenever a transfer happens within the same clock domain, the correctness of the information transfer can be guaranteed by specific digital design tools (synthesis, static timing analysis, etc.). However, for an information transfer between different clock domains, the data correctness can typically not be guaranteed by the tools due to physical phenomenon of meta-stability which cannot be avoided because the data created in source clock domain can change at any moment relative to destination clock domain. In those cases the data correctness has to be guaranteed by digital design methods. Thus, efficient approaches that allow guaranteeing data correctness for data transfers over clock domain boundaries are desirable.

SUMMARY

According to one embodiment, an electronic circuit is provided comprising a first clock domain configured to operate according to a first clock signal, a second clock domain configured to operate according to a second clock signal different from the first clock signal, an encoding circuit, in the first clock domain, configured to encode data to be transmitted from the first clock domain to the second clock domain into codewords and configured to supply the codewords to an interface between the first clock domain and the second clock domain and a reception circuit, in the second clock domain, configured to receive data words from the interface, to decode valid codewords and to discard invalid codewords.

According to a further embodiment, a method for transferring data between clock domains according to the electronic circuit described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

SoCs are becoming more complex these days. A lot of functionality is being added to chips and data is frequently transferred from one clock domain to another.

Figure 1:
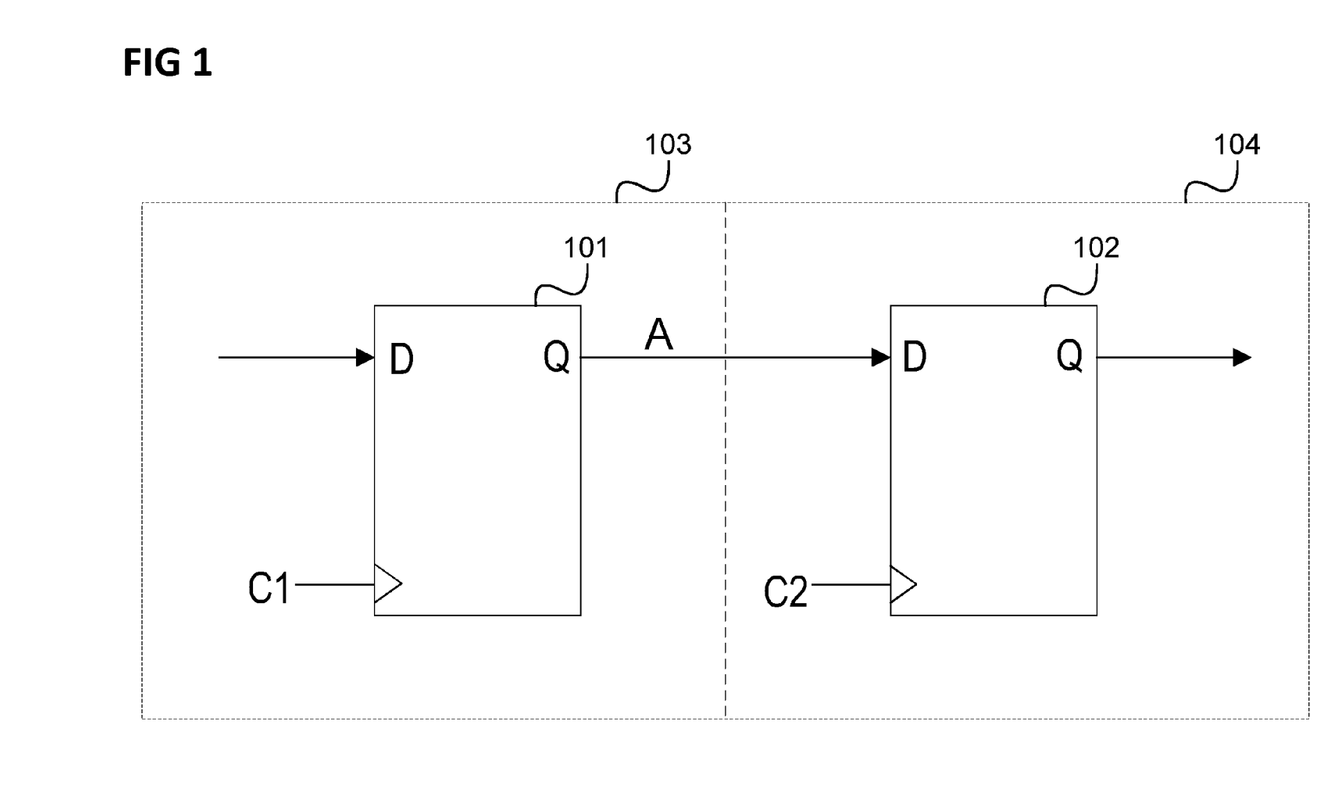
FIG. 1 illustrates a clock domain crossing.

A clock domain crossing typically occurs whenever data is transferred from a flip-flop driven by one clock to a flip-flop driven by another clock as illustrated by FIG. 1.

FIG. 1 illustrates a clock domain crossing.

In the arrangement shown in FIG. 1, the Q output of a first flip-flop 101 is connected to the D input of a second flip-flop 102. The first flip-flop is part of a first clock domain 103 (e.g. of a chip, e.g. a chip card module) and is supplied with a first clock signal C1. The second flip-flop is part of a second clock domain 104 (e.g. of the chip) and is supplied with a second clock signal C2.

In example of FIG. 1, a signal A is launched by the C1 clock domain 103 (output by the first flip-flop 101) and needs to be captured properly by the C2 clock domain 104 (i.e. by the second flip-flop 102). Depending on the relationship between the two clocks C1 and C2, there could be different types of issues in transferring data from the source clock domain 103 to the destination clock domain 104 such as metastability, data loss and data coherency loss.

Regarding loss of data coherency, it should be noted that whenever a bit is transferred from the source clock domain (i.e. the first clock domain 103) to the second clock domain 104 (destination clock domain), it may take one or more destination clock cycles to capture it, depending on the arrival time of active clock edges of the two clocks.

Consider a case where multiple signals (i.e. bits) are being transferred from the first clock domain 103 to the second clock domain 104, wherein each signal is synchronized separately using a pair of flip-flops like the two flip-flops 101, 102 in the example of FIG. 1, i.e. multiple bits are transferred in parallel (e.g. via a multi-bit bus) using a pair of flip-flops like the flip-flops 101, 102 for each bit.

If all the signals are changing simultaneously and the source and destination clock edges arrive close together, some of the signals may get captured in the destination domain in the first clock cycle while some others may be captured in the second clock cycle by virtue of metastability. This may result in an invalid combination of values on the signals at the destination side. Data coherency is said to have been lost in such a case. If the signals are together controlling some function, then such an invalid state may lead to functional errors.

Figure 2:
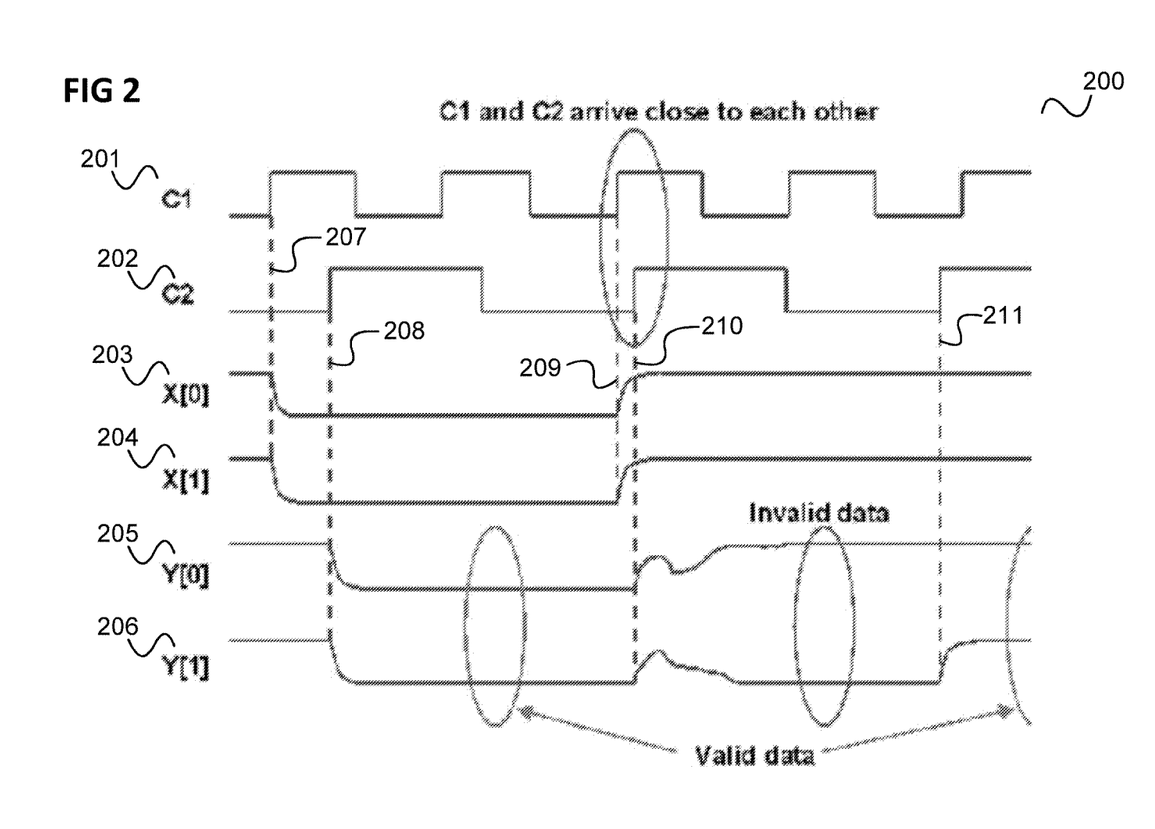
FIG. 2 shows a diagram illustrating an example for a two-bit transfer from a first clock domain to a second clock domain.

FIG. 2 shows a diagram 200 illustrating an example for a two-bit transfer from a first clock domain to a second clock domain, including an example for a loss of data coherency in such a case.

In the diagram 200, time flows from left to right. The diagram 200 shows a first graph 201 illustrating the clock signal of the first clock domain, a second graph 202 illustrating the clock signal of the second clock domain, a third graph 203 showing a signal representing the first bit X[0] of the two output bits output by the first clock domain, a fourth graph 204 showing a signal representing the second bit X[1] of the two output bits output by the first clock domain, a fifth graph 205 showing a signal representing the bit Y[0] corresponding to X[0] as captured by the second clock domain and a sixth graph 206 showing a signal representing the bit Y[1] corresponding to X[1] as captured by the second clock domain.

As an example, it is assumed that "00" and "11" are two valid values for the two-bit-signal X[0:1] output by the first clock domain. In the example of FIG. 2, initially at a first time 207, there is a transition from 1→0 on both the bits of X. Both the transitions get captured by the second clock domain in the first cycle itself at a second time 207. Hence the signal two-bit signal Y[0:1] becomes "00".

Next, at a third time 209, there is a transition from 0→1 on both the bits of two-bit signal X[0:1], i.e. 00→11. Here the rising edge of the second domain clock C2, at a fourth time 210, comes close to the transition on signal X. Thus, in this example, while the transition on X[0] is captured in the first clock cycle at the fourth time 210, the transition on X[1] gets captured in second clock cycle of C2 at a fifth time 211. This results in an intermediate value of "10" on Y[0:1] which is an invalid state. Data coherency is lost in this case.

Thus, straight clock domain crossing with a multi-bit value may lead to data coherency loss after synchronization because every bit of the bus is synchronized separately and the multi-bit value in destination domain may show wrong intermediate values, resulted from uncertainty of bus sampling in destination domain.

Loss of data coherency when a multi-bit (bus) value is transferred from one clock domain into another clock domain as illustrated in FIG. 2 may be avoided by one of the following:
1. locking the data bus in clock source domain, and send a control signal which is synchronized in destination domain, and then register data in destination domain.
2. locking the data bus in clock source domain, and use a bi-directional control handshake signals.
3. use a First-In-First-Out buffering with memory storage which receives data with source clock domain and outputs data in destination clock domain.
4. Encode the data bus with Gray encoding, synchronizing data in destination domain and decode from Gray to original data in destination domain.

The control signal/handshake based solutions 1 and 2 work for any source random data changes, but have clock constraint limitations and add latency due to the control signal/handshake. The asynchronous FIFO approach 3 works for random data changes and has low latency but has higher complexity and costs. The Gray encoding has low latency due to missing of control handshakes, but this approach only works when source data changes monotonically, and does not work for random changes of source data bus.

In the following, an approach allowing transferring data between different clock domains is described which is flexible in terms of the data to be transferred and does not require a handshake control signal, i.e. can be seen as a pure open loop variant.

Figure 3:
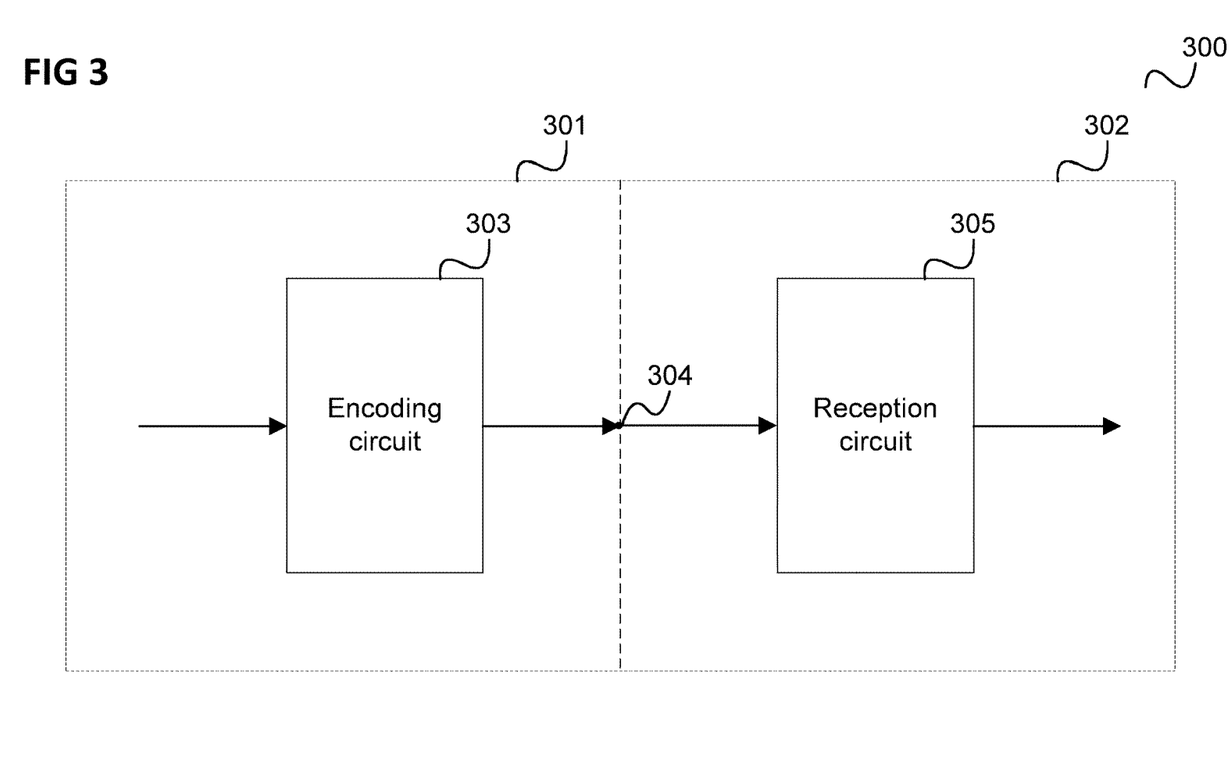
FIG. 3 shows an electronic circuit according to an embodiment.

FIG. 3 shows an electronic circuit 300.

The electronic circuit 300 comprises a first clock domain 301 configured to operate according to a first clock signal (i.e. the components of the first clock domain are clocked by the first clock signal) and a second clock domain 302 configured to operate according to a second clock signal (i.e. the components of the second clock domain are clocked by the second clock signal) different from the first clock signal (i.e. having a higher or a lower frequency).

The first clock domain 301 comprises an encoding circuit 303 configured to encode data to be transmitted from the first clock domain 301 to the second clock domain 302 into codewords and configured to supply the codewords to an interface 304 between the first clock domain 301 and the second clock domain 302.

The second clock domain 302 comprises a reception circuit 305 configured to receive data words from the interface 304, to decode valid codewords and to discard invalid codewords.

According to one embodiment, in other words, data are encoded before their transfer via a clock domain boundary and the receiving clock domain checks whether the words received are valid codewords. Invalid codewords are discarded assuming that they have been caused by a data coherency loss.

For example, data to be transferred from the first clock domain 301 to the second clock domain 302 comprise values in a binary representation in the form of a collection of N bits on a data bus wherein the data bus has a synchronous behavior which means that bits change as a consequence of a clock change. The source data bus (data bus in the first clock domain) may change from a binary value to another binary value which can be represented by N bits.

According to one embodiment, a selection of source data bus binary patterns (i.e. binary values of the data to be transferred) are encoded with a map table and the encoded result is stored in an M-bit length register located in source clock domain (i.e. the first clock domain). The register outputs are transferred into the destination clock domain (i.e. the second clock domain) using a synchronizer comprising a dual stage synchronization circuits for each line of the M lines. The outputs of the synchronizer are used to decode and restore the original bus patterns (i.e. the source data bus binary patterns that were encoded) with the inverse function of encoding map table and store the result in a register in the destination clock domain.

According to one embodiment, the codewords are codewords of a predetermined code.

For example, every two codewords of the code have a Hamming distance of two between them.

Each codeword for example differs by one bit from a predetermined value.

The electronic circuit may be configured to receive the predetermined value and to generate the codewords based on the predetermined value.

According to one embodiment, the reception circuit is configured to check, for a received data word, whether the data word is a codeword of the code and to decode the data word if it is a codeword of the code and to discard it else.

The reception circuit may for example be configured to store decoded data words in a data register in the second clock domain.

According to one embodiment, the reception circuit is configured, for every data word received from the interface, to overwrite a previously decoded data word with the decoded data word in the data register if the data word is a valid codeword and to maintain the previously decoded data word in the data register if the data word is an invalid codeword.

For example, the data to be transmitted are a sequence of binary values, wherein each binary digit is given by a line of a multi-bit data bus connected to the encoding circuit.

The encoding circuit is for example configured to encode each binary value into a codeword.

According to one embodiment, the interface comprises a synchronizer configured to synchronize the codewords to the second clock signal.

The encoding circuit is for example configured to supply the bits of each codeword in parallel to the interface by means of a plurality of bit lines and the synchronizer for example comprises a synchronization circuit for each bit line of the plurality of plurality of bit lines.

The synchronizer is for example a multi-stage synchronizer.

According to one embodiment, the encoding circuit is configured to supply the codewords to the interface by means of a code register connected to the interface.

Figure 4:
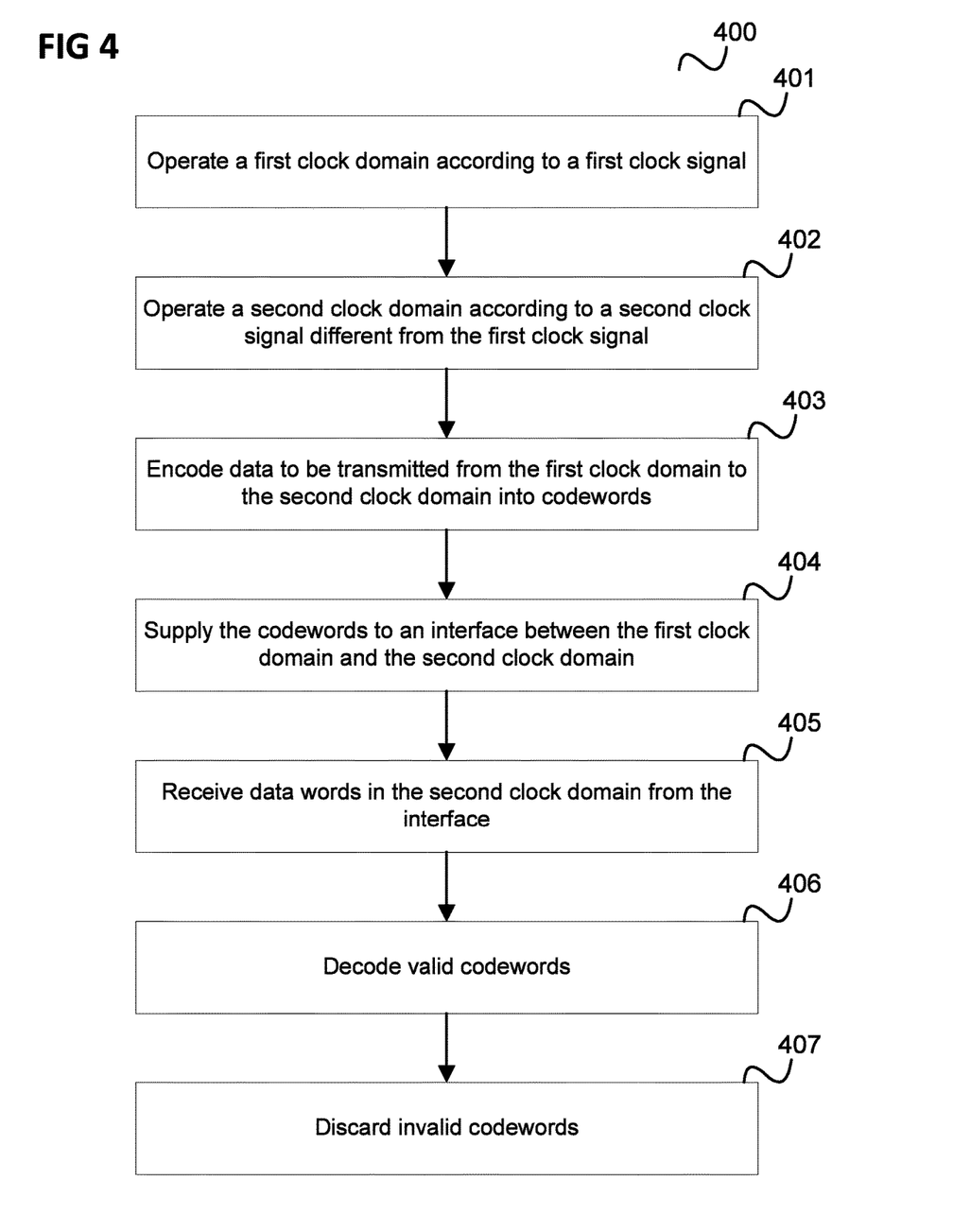
FIG. 4 shows a flow diagram according to an embodiment.

The electronic circuit 300 for example carries out a method for transferring data between clock domains as illustrated in FIG. 4.

FIG. 4 shows a flow diagram 400.

In 401, a first clock domain is operated according to a first clock signal.

In 402, a second clock domain is operated according to a second clock signal different from the first clock signal.

In 403, data to be transmitted from the first clock domain to the second clock domain is encoded into codewords.

In 404, the codewords are supplied to an interface between the first clock domain and the second clock domain.

In 405, the data words are received in the second clock domain from the interface.

In 406, valid codewords are decoded.

In 407, invalid codewords are discarded.

It should be noted that embodiments described in context of the electronic circuit 300 are analogously valid for the method for transferring data between clock domains illustrated in FIG. 4.

In the following, embodiments are described in more detail.

Figure 5:
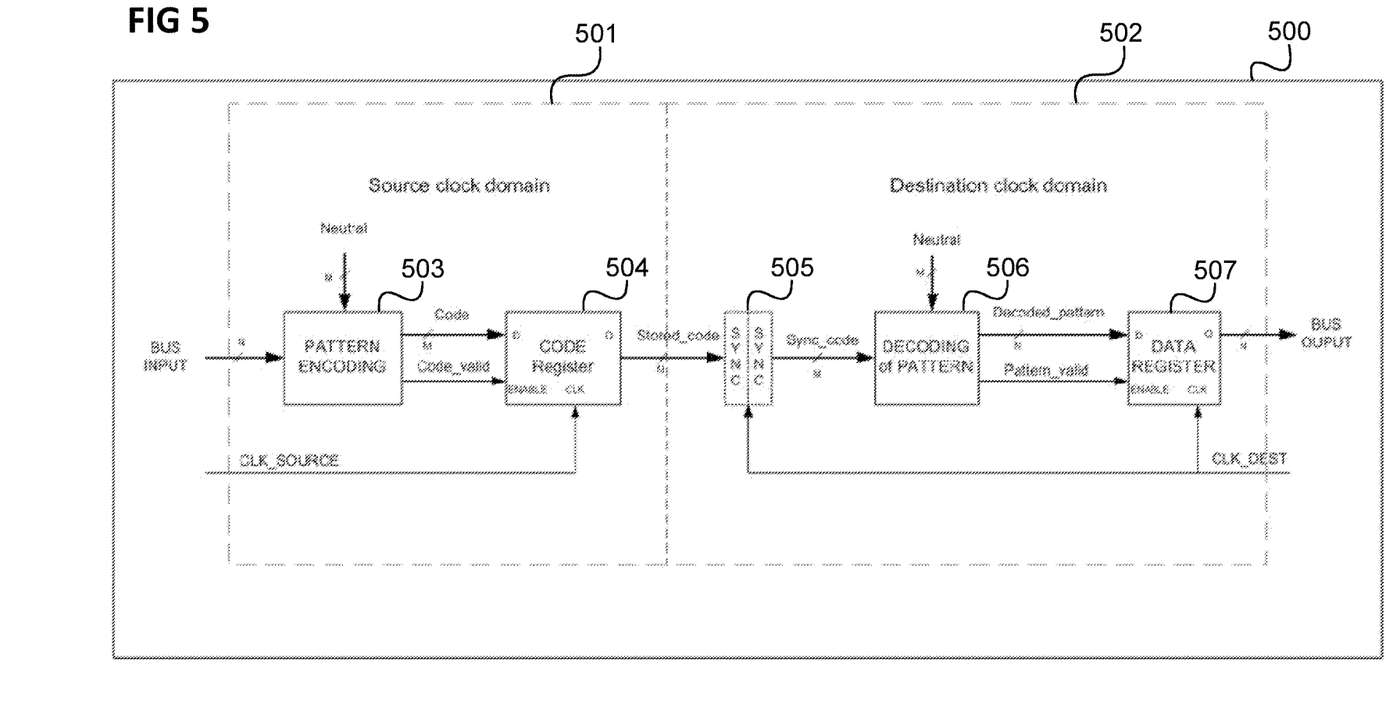
FIG. 5 shows a circuit for transferring data from a first clock domain to a second clock domain.

FIG. 5 shows a circuit 500 for transferring data from a first clock domain (source clock domain) 501 to a second clock domain (destination clock domain) 502.

For transferring an N-bit-pattern the N-bit-pattern is replaced by a codeword according to an encoding function, e.g. given by an encoding table, by a pattern encoding circuit 503. The codeword is stored in a codeword register 504 in the source clock domain 501. The registered (i.e. stored) codeword is synchronized by a synchronizer 505 (e.g. a dual-stage synchronizer) in destination clock domain 502 and then the original N-bit-pattern (that was encoded) is restored by a pattern decoding circuit 506 using the inverse of the encoding function and stored in a data register 507.

As described above with reference to FIGS. 1 and 2, using a parallel synchronization for a data bus may generate incorrect data at the synchronizer output due to one-clock uncertainty after parallel synchronization. A part of bits might be synchronized with same destination clock domain clock edge, but some might miss that edge and be synchronized with next edge. Thus, when bus is changing in source clock domain, after parallel synchronization, a temporary unexpected data may be created, although this artifact value did not exist in source clock domain. The usage of a data encoding before the synchronization as described with reference to FIG. 5 and in further detail below allows detection of incorrect temporary values and removes the incoherent values after the synchronization. If the synchronized value (i.e. the output of synchronizer 505) is not a valid codeword, then the value is not stored in the data register 507. The use of the special encoding as described below guarantees the correctness of the restored data pattern in destination domain when using a parallel synchronization and the source domain data changes randomly. This correctness is guaranteed by filtering out the incorrect data which is detected as an invalid code and discarded. This encoding is different and simpler compared to Gray type encoding, and does not have the limitation that source data has to change monotonically, thus accepting random data source changes.

For each N-bit-pattern to be transferred a unique code which is associated with that pattern is used. This means that the pattern encoding circuit 503 maps different N-bit-patterns to different M-bit codewords, e.g. according to Table 1

TABLE 1

| Input Data Bus (bus size = N bits) | Code (code size = M bits) | Code_valid (1 bit size) | Code register action (bus size = M bits) |
|---|---|---|---|
| Pattern 1 | Code(1) | 1 | Store code |
| Pattern 2 | Code(2) | 1 | Store code |
| Pattern 3 | Code(3) | 1 | Store code |
| Pattern 4 | Code(4) | 1 | Store code |
| . . . | . . . | 1 | Store code |
| Pattern M | Code(M) | 1 | Store code |
| Any other value | Don't care | 0 | Do not store, keep old value |

The pattern encoding circuit 503 may enable the code register 504 using the Code_valid bit to store a codeword.

The M codewords may be seen as a subspace $S_h$ of the space S of all M-bit-words. In other words, the encoding function maps the input data bit patterns (i.e. input n-bit bus values) to the subspace $S_h$.

The pattern decoding circuit 506 in turn performs a decoding of codewords of the code and discards words that are not valid codewords, i.e. keeps the word stored in the data register unchanged if it receives a word that is not a valid codeword. For example, the pattern decoding circuit 506 operates according to table 2, wherein the output pattern of the synchronizer 505 is referred to as Sync_code.

TABLE 2

| Sync_code (bus size = M bits) | Decoded pattern (bus size = N bits) | pattern_valid (1 bit size) | Data register action (bus size = M bits) |
|---|---|---|---|
| Code(1) | Pattern 1 | 1 | Store pattern |
| Code(2) | Pattern 2 | 1 | Store pattern |
| Code(3) | Pattern 3 | 1 | Store pattern |
| Code(4) | Pattern 4 | 1 | Store pattern |
| . . . | . . . | 1 | Store pattern |
| Code(M) | Pattern M | 1 | Store pattern |
| Any other value | Don't care | 0 | Do not store, keep old value |

In other words, the decoding function maps each codewords to its corresponding pattern (inversely to the encoding) and ignores (discards) all words that are not part of the subspace $S_h$ of codewords. For example, the pattern decoding circuit 506 supplies the pattern_valid bit to an enable input of the data register 507 and thus controls the data register 507 to store the current decoded codeword or maintain the previously stored decoded codeword.

If the number of possible source patterns increases more different codewords are required to be associated with the possible patterns. Thus the number of bit patterns which can be transferred influences the bit-size of the code.

In the embodiment described in the following, an m-bit length code according to the following code definition rule is used: the code used has a Hamming distance of 1 between all of its codewords and an m-bit binary value called neutral value. As a consequence of this rule, the codewords of the code have a Hamming distance of 2 between every two of them and each of them is located at a Hamming distance of 1 from the neutral value.

Figure 6:
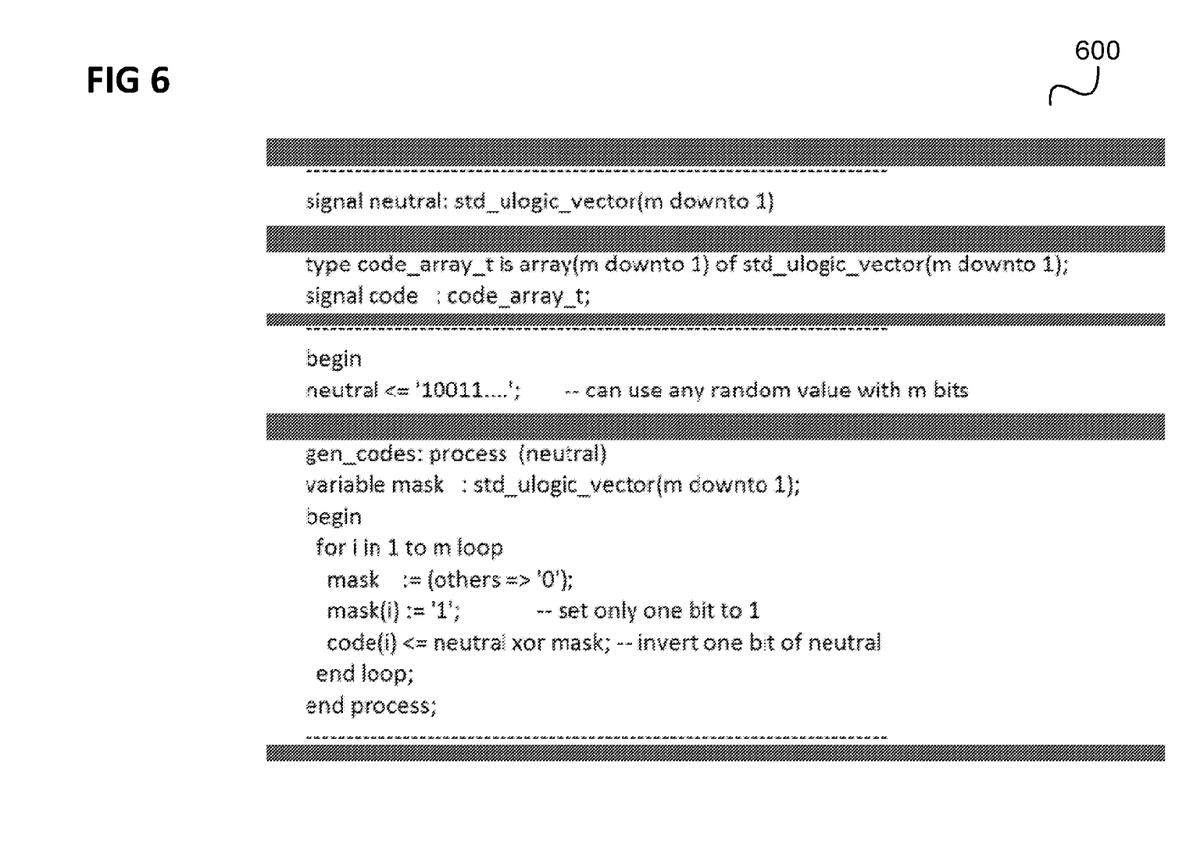
FIG. 6 shows a VHDL code snippet for generating codewords.

FIG. 6 shows a VHDL code snippet 600 which generates m code values starting from a neutral value by inverting one bit at a time.

For example, the pattern encoding circuit 503 is supplied with the neutral value and generates the codewords to be used for the encoding.

If the number of possible input patterns is M, then the encoding function associates M unique codes. In this case, the bit size of the resulting codes is M, because starting from a neutral value with M bits a maximum of M different codewords may be generated according to the above code definition rule.

Due to the fact that the code for encoding by the pattern encoding circuit 503 follow the above described rule any change of the source data bus pattern is transformed in a change of one codeword which results in a 2-bit change at the clock domain border (i.e. at the interface between the clock domains). This means that the synchronizer 505 sees a change of the bits for two of its M input lines even if the input source data pattern changes with a random, possibly higher, number of bits. This ensures that data register 507 outputs consistent data.

Let the neutral value have the following M-bit representation with each bit denoted by a b with an index:
Neutral value=$b_1\ b_2\ \ldots\ b_i\ \ldots\ b_j\ \ldots\ b_M$ Here, $b_i$ represents a bit value which may have a random value of either 0 or 1. In the following, a bar placed over a bit notation $b_i$, i.e. $\overline{b_i}$, means that the value of the bit is inverted.

Further, Code(i) in the following represents the i-th codeword from the set of codewords generated from the neutral value and pattern(i) represents the i-th value form the set of patterns which are selected to be transferred into the destination clock domain 502.

To implement the rule that all codes are located at Hamming distance of 1 from the neutral value, the codewords can be generated by negating only one bit from neutral, but always negating a different bit for each code. The maximum number of codes is equal to M because the length of the neutral value is M and every different codeword is obtained by changing only one bit at a time. Thus, two different codewords look like:
Code(i)=$b_1\ b_2\ \ldots\ \overline{b_i}\ bj\ \ldots\ b_M$
Code(j)=$b_1\ b_2\ \ldots\ bi\ \ldots\ \overline{b_j}\ \ldots\ b_M$
with i≠j.

At the input of the synchronizer 505, in case of a change of the N-bit-input pattern, two lines change simultaneously. For example, in case of a change from Code(i) (at a time $t_0$) to Code (j) (at a time $t_1$) the i-th bit line changes from $\overline{b_i}$ to bi, while j-th line changes from bj to $\overline{b_j}$. All the other of the M input lines stay unchanged.

Figure 7:
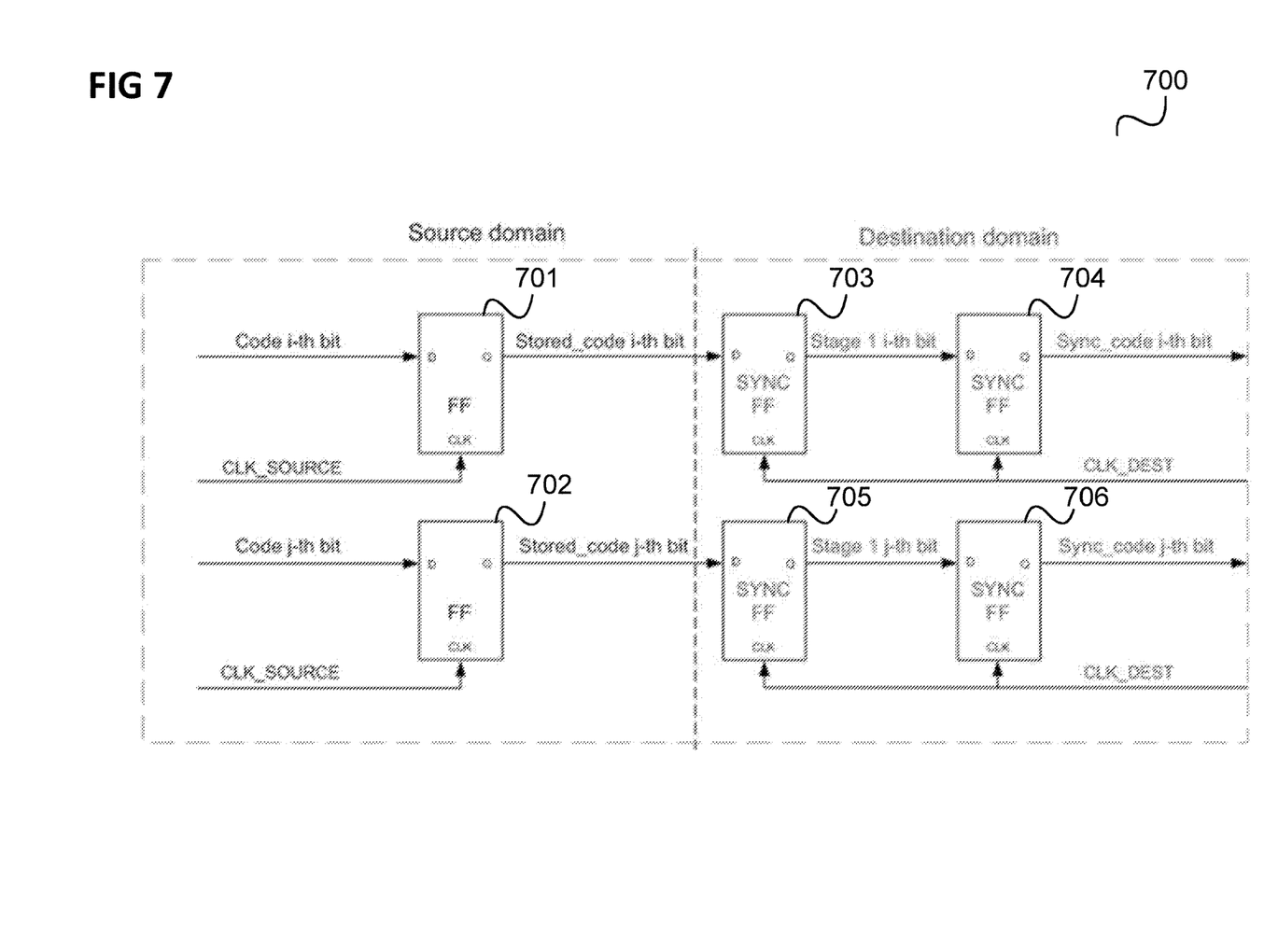
FIG. 7 illustrates a clock domain crossing for two bit lines.

FIG. 7 illustrates the clock domain crossing for the i-th-bit line and the j-th bit line.

In the source domain, the i-th flip-flop 701 of the code register 504 and the j-th 702 flip-flop of the code register 504 are shown. For the destination domain, the i-th synchronization flip-flop 703 of the first stage, the i-th synchronization flip-flop 704 of the second stage, the j-th synchronization flip-flop 705 of the first stage, and the j-th synchronization flip-flop 706 of the second stage of the synchronizer 505 are shown.

The i-th flip-flop 701 of the code register 504 receives the i-th bit of the current codeword, stores this bit, and outputs it to the i-th synchronization flip-flop 703 of the first stage of the synchronizer 505. The i-th synchronization flip-flop 703 of the first stage and the i-th synchronization flip-flop 704 of the second stage of the synchronizer 505 perform a synchronization of the received bit to the destination cock domain clock to generate the i-th bit of the synchronized codeword. The output line of the i-th synchronization flip-flop 704 of the second stage of the synchronizer 505 is referred to as synchronized i-th line.

The j-th flip-flop 701 of the code register 504 receives the j-th bit of the current codeword, stores this bit, and outputs it to the j-th synchronization flip-flop 705 of the first stage of the synchronizer 505. The j-th synchronization flip-flop 705 of the first stage and the j-th synchronization flip-flop 706 of the second stage of the synchronizer 505 perform a synchronization of the received bit to the destination cock domain clock to generate the j-th bit of the synchronized codeword. The output line of the j-th synchronization flip-flop 706 of the second stage of the synchronizer 505 is referred to as synchronized j-th line.

In case of a change from Code(i) to Code(j) there are three possible cases of transitions in the destination domain 502 at the synchronized i-th line and the synchronized j-th line:
1. Synchronized i-th line and synchronized j-th line change simultaneous to new values. Thus, the output pattern of the synchronizer 505 changes from Code(i) to Code(j) which is correct.
   At time t0: Sync_code=$b1\ b2\ \ldots\ \overline{b_i}\ \ldots\ b_j\ \ldots\ b_M$ which is Code(i)
   At time t1: Sync_code=$b1\ b2\ \ldots\ b_i\ \ldots\ \overline{b_j}\ \ldots\ b_M$ which is Code(j)
   The data register 507 which stores the result of the inverse decoding thus shows a correct change from pattern(i) corresponding to Code(i) to pattern(j) corresponding to Code(j)
2. Synchronized i-th line changes first and j-th line changes after a delay of one destination clock cycle. Thus, the output pattern of the synchronizer 505 changes as follows:
   At time t0: Sync_code=$b1\ b2\ \ldots\ \overline{b_i}\ \ldots\ b_j\ \ldots\ b_M$ which is Code(i)
   At time t1: Sync_code=$b1\ b2\ \ldots\ b_i\ \ldots\ bj\ \ldots\ b_M$ which is the neutral value
   At time t2: Sync_code=$b1\ b2\ \ldots\ b_i\ \ldots\ \overline{b_j}\ \ldots\ b_M$ which is Code(j)
   As shown, there is an intermediate value between the Code(i) and Code(j) but this value is the neutral value which is not a valid codeword and is discarded by the pattern decoding circuit 506. This means that the incorrect intermediate value is filtered out and no value is stored in data register 507 for the intermediate value.
   The data register 507 thus shows a correct change from pattern(i) corresponding to Code(i) to pattern(j) corresponding to Code(j).
3. Synchronized j-th line changes first and i-th line changes after a delay of one destination clock cycle. Thus, the output pattern of the synchronizer 505 changes as follows:
   At time t0: Sync_code=$b1\ b2\ \ldots\ \overline{b_i}\ \ldots\ b_j\ \ldots\ b_M$ which is Code(i)

At time t1: Sync_code=b1 b2 ... $\overline{b}_i$ ... $\overline{b}_j$ ... $b_M$ which is an artifact value At time t2: Sync_code=b1 b2 ... $b_i$ ... $\overline{b}_j$ ... $b_M$ which is Code(j)

As shown, after synchronization there is an intermediate artifact value between the Code(i) and Code(j). This value is not a valid codeword because it differs in two bits from the neutral value. Therefore, the pattern decoding circuit 506 filters out the artifact value as an invalid codeword and no value is stored in the data register 507 for the artifact value. The final data register thus shows a correct change from pattern(i) corresponding to Code(i) to pattern(j) corresponding to Code(j).

Figure 8:
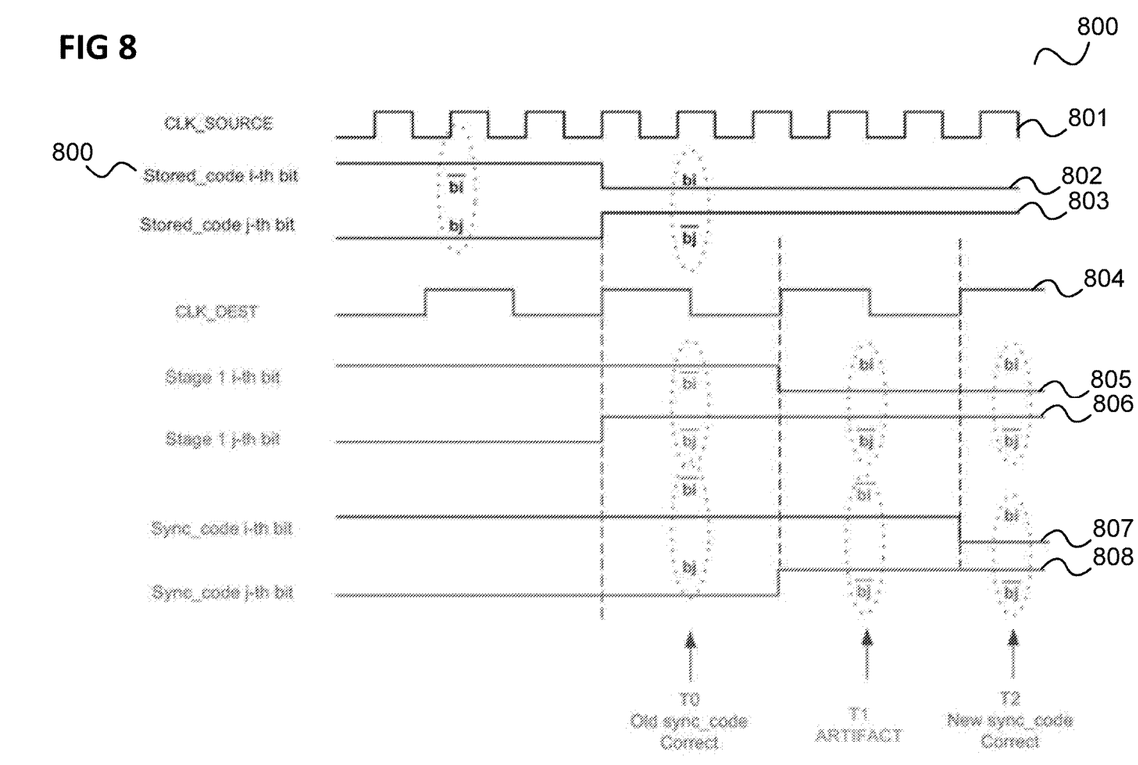
FIG. 8 shows a wave diagram illustrating the occurrence of an artifact value in a clock domain crossing.

FIG. 8 shows a wave diagram 800 illustrating case 3, i.e. the occurrence of an artifact value.

In the wave diagram 800 time flows from left to right.

A first graph 801 shows the clock signal of the source domain 501, a second graph 802 shows the state of the i-th input line of the synchronizer 505, a third graph 803 shows the state of the j-th input line of the synchronizer 505.

A fourth graph 804 shows the clock signal of the destination domain 504, a fifth graph 805 shows the state of the output of the i-th synchronization flip-flop 703 of the first stage, a sixth graph 806 shows the state of the output of the j-th synchronization flip-flop 705 of the first stage, a seventh graph 807 shows the state of the output of the i-th synchronization flip-flop 704 of the second stage and an eighth graph 808 shows the state of the output of the j-th synchronization flip-flop 706 of the second stage.

At the beginning of an interval T0 the codeword changes from Code(i) to Code(j) as indicated by the second graph 802 and the third graph 803. The interval T0 lasts until the next rising clock edge of the of the destination clock domain clock. In T0, the output lines of the flip-flops of the first stage 703, 705 correspond to the artifact value while the output lines of the flip-flops of the second stage 704, 705 still correspond to Code(i).

After T0, in the next destination clock domain clock cycle T1, the output lines of the flip-flops of the first stage 703, 705 correspond to Code(j) while output lines of the flip-flops of the second stage 704, 706 correspond to the artifact value (which is discarded by the pattern decoding circuit 506). After T1, in the next destination clock domain clock cycle T2, both the flip-flops of the first stage 703, 705 and the flip-flops of the second stage 704, 706 correspond to Code (j).

It should be noted that in the special case that the neutral value consists of all zero bits, the encoding according to the codeword generation as described above is one-hot encoding. If the neutral value consists of all 1 bits the resulting encoding which is the one-cold encoding.

The above approach can be used to monitor a data bus and check for occurrences of specific patterns and transfer patterns (e.g. finite state machine states) to another clock domain. According to various embodiments, it has lower latency compared to handshake based mechanisms, is an open loop solution type having no feedback between clock domains and has lower complexity than a FIFO solution. It may be used for clock domain crossing of a sub-set of possible bus values but may also be used to cover the whole binary space of possible source clock domain bus values at an increase hardware cost (e.g. for the synchronizer etc.).

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. An electronic circuit device comprising:
   a first clock domain configured to operate according to a first clock signal; wherein the first clock domain receives data; wherein the first clock domain comprises:
      an encoding circuit configured to encode the data into encoded data using codewords;
   a second clock domain configured to operate according to a second clock signal different from the first clock signal; wherein the second clock domain comprises:
      a reception circuit configured to receive the encoded data and decode the encoded data into valid decoded data codewords and invalid decoded data codewords and to discard the invalid decoded data codewords; and
   an interface between the first clock domain and the second clock domain; wherein the interface is configured to receive the encoded data from the first clock domain and configured to transmit the encoded data to the second clock domain; wherein the interface comprises a synchronizer configured to synchronize the encoded data to the second clock signal; and wherein the encoding circuit is configured to supply the bits of each codeword of the encoded data in parallel to the interface by means of a plurality of bit lines and wherein the synchronizer comprises a synchronization circuit for each bit line of the plurality of plurality of bit lines.

2. The electronic circuit of claim 1, wherein the encoded data are codewords of a predetermined code.

3. The electronic circuit of claim 2, wherein every two codewords of the code have a Hamming distance of two between them.

4. The electronic circuit of claim 2, wherein each codeword differs by one bit from a predetermined value.

5. The electronic circuit of claim 4, wherein the encoding circuit is configured to receive the predetermined value and to generate the codewords based on the predetermined value.

6. The electronic circuit of claim 2, wherein the reception circuit is configured to check, for a received data word, whether the data word is a codeword of the code and to decode the data word if it is a codeword of the code and to discard it else.

7. The electronic circuit of claim 1, wherein the reception circuit is configured to store decoded data words in a data register in the second clock domain.

8. The electronic circuit of claim 7, wherein the reception circuit is configured, for every data word received from the interface, to overwrite a previously decoded data word with the decoded data word in the data register if the data word is a valid decoded data codeword and to maintain the previously decoded data word in the data register if the data word is an invalid decoded data codeword.

9. The electronic circuit of claim 1, wherein the data to be transmitted are a sequence of binary values, wherein each binary digit is given by a line of a multi-bit data bus connected to the encoding circuit.

10. The electronic circuit of claim 9, wherein the encoding circuit is configured to encode each binary value into a encoded data codeword.

11. The electronic circuit of claim 1, wherein the synchronizer is a multi-stage synchronizer.

12. The electronic circuit of claim 1, wherein the encoding circuit is configured to supply the encoded data to the interface by means of a code register connected to the interface.

13. The electronic circuit of claim 1, wherein the encoding circuit encodes the data before any synchronizing of the data to a second clock signal occurs.

14. A method for transferring data between clock domains comprising receiving data, by a first clock domain;
   operating the first clock domain according to a first clock signal;
   operating a second clock domain according to a second clock signal different from the first clock signal;
   encoding the data into encoded data to be transmitted from the first clock domain to the second clock domain using codewords;
   supplying the encoded data to an interface between the first clock domain and the second clock domain; wherein the interface comprises a synchronizer configured to synchronize the encoded data to the second clock signal; and wherein the encoding circuit supplies the bits of each codeword of the encoded data in parallel to the interface by means of a plurality of bit lines and wherein the synchronizer comprises a synchronization circuit for each bit line of the plurality of plurality of bit lines;
   receiving the encoded data in the second clock domain from the interface;
   decoding the encoded data into valid decoded data codewords and invalid decoded data codewords; and
   discarding the invalid decoded data codewords.

* * * * *